(12) United States Patent
Park et al.

(10) Patent No.: US 7,746,070 B2
(45) Date of Patent: Jun. 29, 2010

(54) METHOD FOR GENERATING HIGH RESOLUTION MRI IMAGE AND RECORDING MEDIUM THEREOF

(75) Inventors: Hyun Wook Park, Daejeon (KR); Seong Dae Yun, Daegu (KR)

(73) Assignee: Korea Advanced Institute of Science & Technology (KR)

( * ) Notice: Subject to any disclaimer, the term of this patent is extended or adjusted under 35 U.S.C. 154(b) by 330 days.

(21) Appl. No.: 11/782,504

(22) Filed: Jul. 24, 2007

(65) Prior Publication Data
US 2008/0312525 A1 Dec. 18, 2008

(30) Foreign Application Priority Data
Jun. 15, 2007 (KR) .................. 10-2007-0058917

(51) Int. Cl.
*G01V 3/00* (2006.01)
(52) U.S. Cl. ........................ 324/309; 324/307
(58) Field of Classification Search ......... 324/300–322; 600/410–435
See application file for complete search history.

(56) References Cited

U.S. PATENT DOCUMENTS

| | | | |
|---|---|---|---|
| 6,510,253 B1 * | 1/2003 | Yamada | 382/300 |
| 6,862,435 B2 * | 3/2005 | Miyano et al. | 455/114.1 |
| 6,965,232 B2 | 11/2005 | Sodickson | |
| 7,504,828 B2 * | 3/2009 | Kagami | 324/322 |
| 2003/0142875 A1 * | 7/2003 | Goertzen | 382/240 |
| 2007/0239003 A1 * | 10/2007 | Shertukde et al. | 600/437 |
| 2008/0143334 A1 * | 6/2008 | Kagami | 324/322 |

FOREIGN PATENT DOCUMENTS

WO WO03063680 8/2003

OTHER PUBLICATIONS

"An Efficient Method for Dynamic Magnetic Resonance Imaging," Liang et al., IEEE Transactions on Medical Imaging, vol. 13, No. 4, Dec. 1994.

* cited by examiner

*Primary Examiner*—Brij B Shrivastav
*Assistant Examiner*—Dixomara Vargas
(74) *Attorney, Agent, or Firm*—The Belles Group, P.C.

(57) ABSTRACT

The present invention relates to a high-resolution magnetic resonance imaging (MRI) image generating method using a new MRI image method called a generalized series parallel imaging technique, and a recording medium thereof. In the high-resolution MRI image generating method using the generalized series parallel imaging technique according to the present invention, selecting only a predetermined low frequency band of all frequency bands, and sampling the predetermined low frequency band of all frequency bands at a lower rate than a Nyquist rate to acquire magnetic resonance data.

12 Claims, 9 Drawing Sheets

[Fig 1]
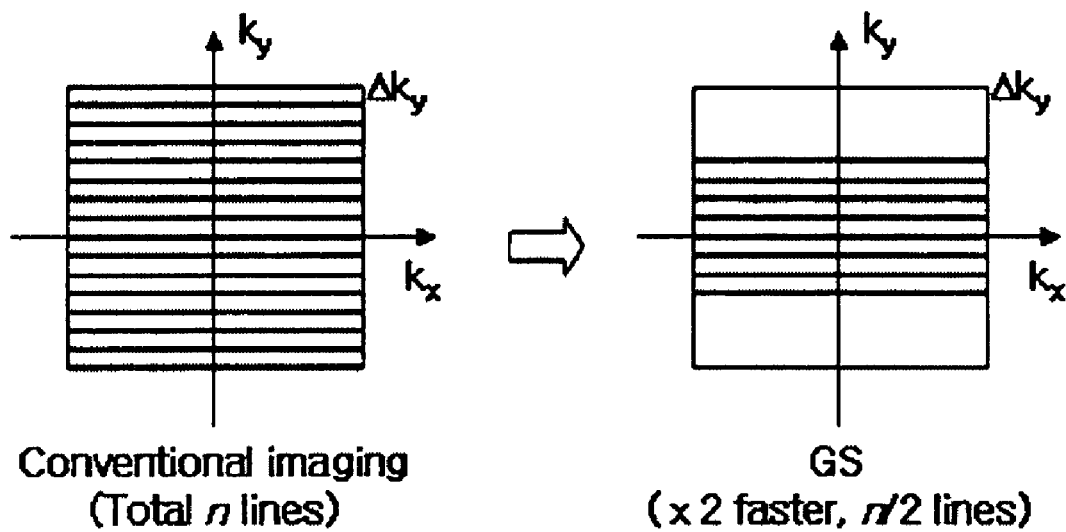
PRIOR ART

[Fig 2]
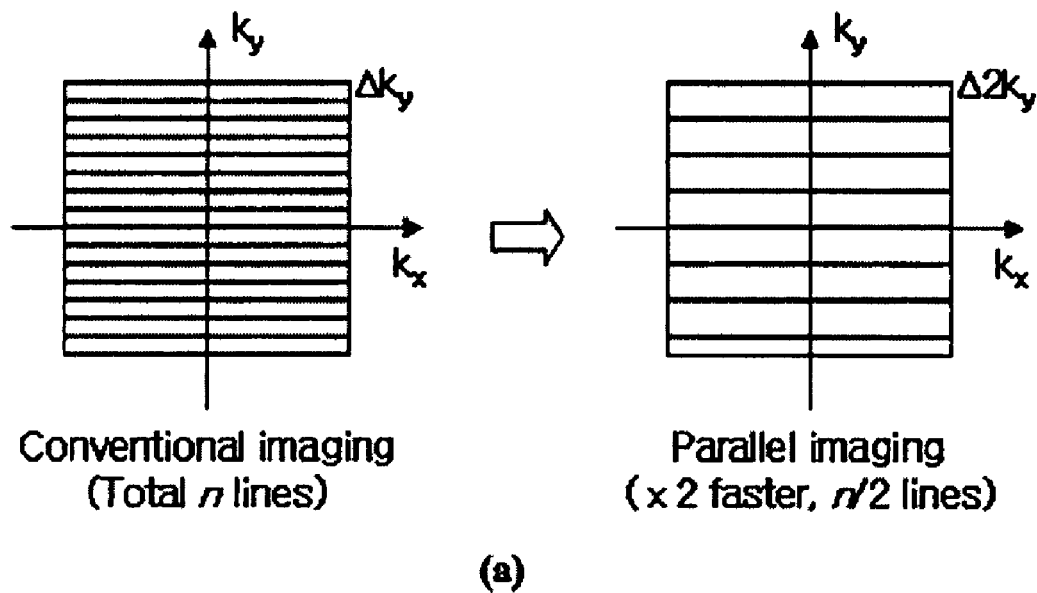
(a)
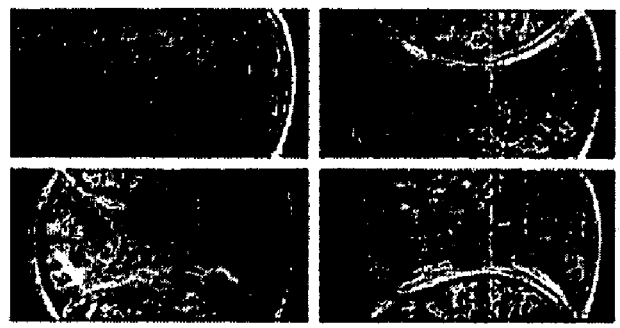
(b)
PRIOR ART

[Fig 3]
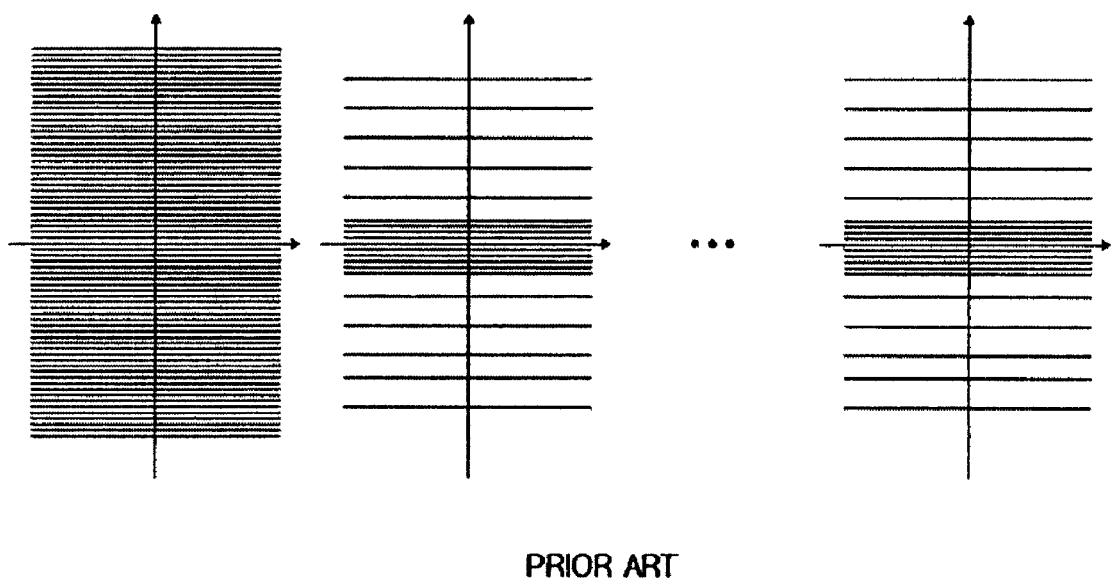
PRIOR ART

[Fig 4]
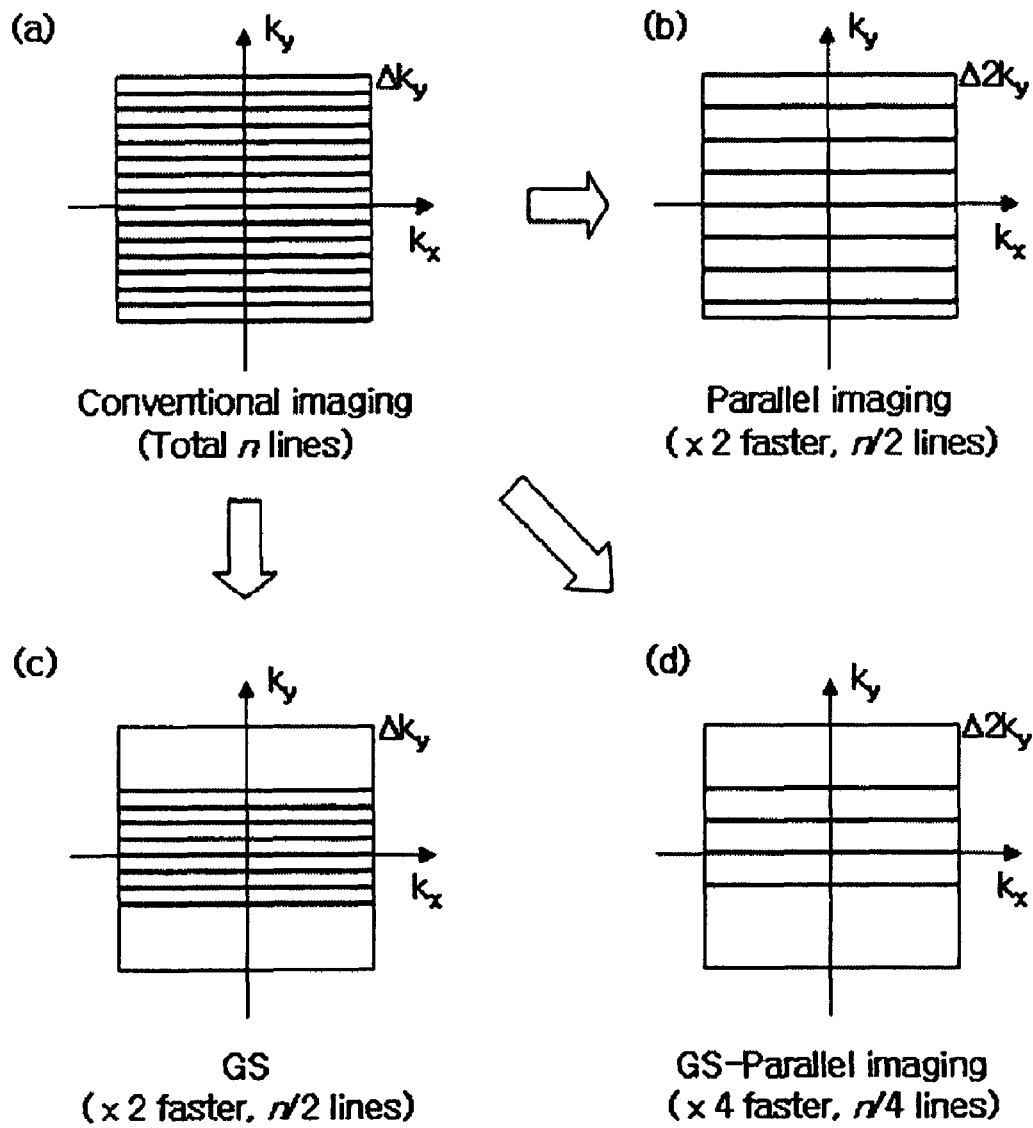

[Fig 5]
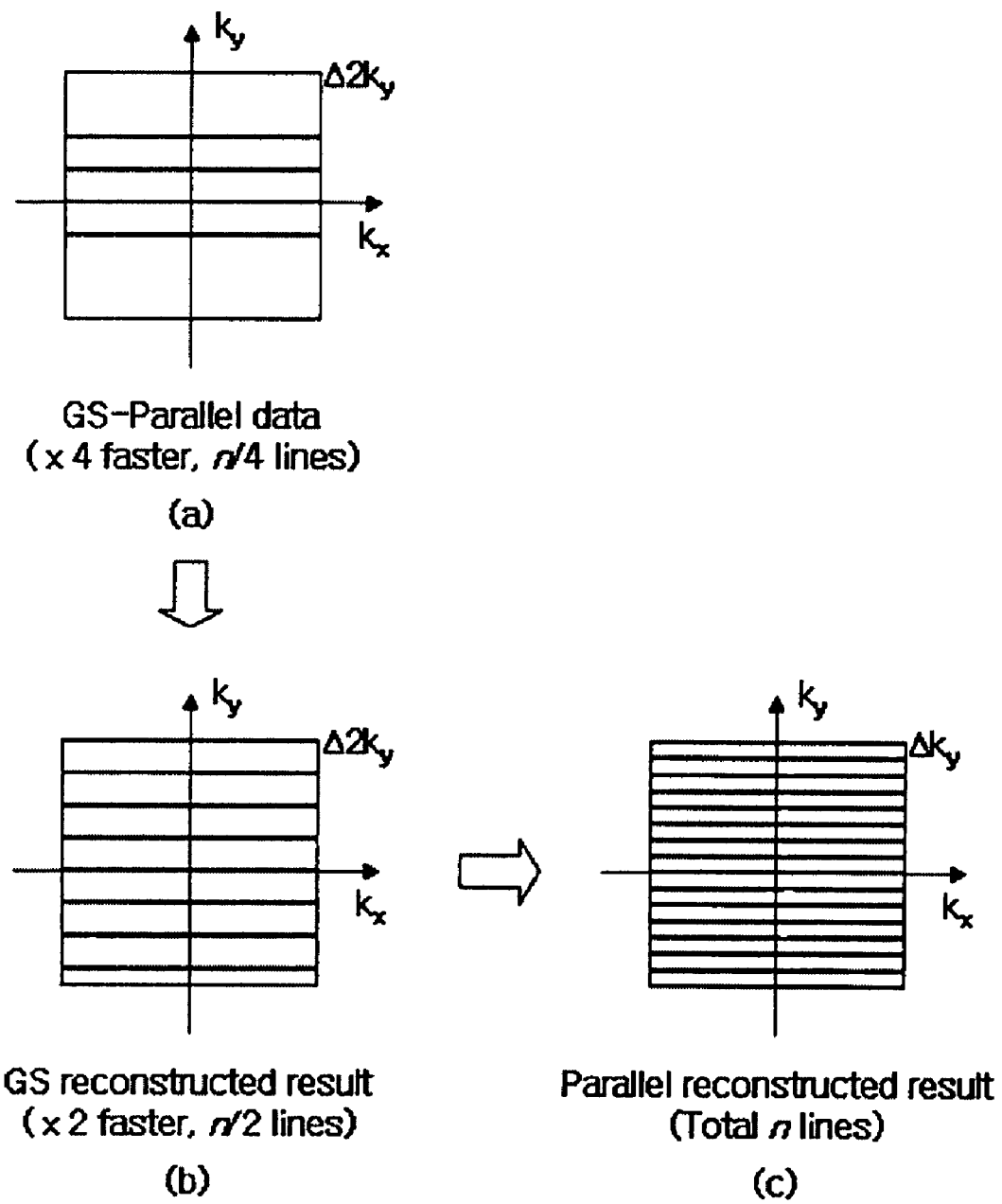

[Fig 6]

$$\begin{pmatrix} S_1(G_y^1,x) \\ \cdot \\ S_1(G_y^F,x) \\ S_2(G_y^1,x) \\ \cdot \\ S_2(G_y^F,x) \\ \cdot \\ \cdot \\ S_K(G_y^1,x) \\ \cdot \\ S_K(G_y^F,x) \end{pmatrix} = \begin{pmatrix} W_1(x,1)e^{i\gamma(G_y^1 1\tau)} \ldots W_1(x,N)e^{i\gamma(G_y^1 N\tau)} \\ \\ W_1(x,1)e^{i\gamma(G_y^F 1\tau)} \ldots W_1(x,N)e^{i\gamma(G_y^F N\tau)} \\ W_2(x,1)e^{i\gamma(G_y^1 1\tau)} \ldots W_2(x,N)e^{i\gamma(G_y^1 N\tau)} \\ \cdot \\ W_2(x,1)e^{i\gamma(G_y^F 1\tau)} \ldots W_2(x,N)e^{i\gamma(G_y^F N\tau)} \\ \cdot \\ \cdot \\ W_K(x,1)e^{i\gamma(G_y^1 1\tau)} \ldots W_K(x,N)e^{i\gamma(G_y^1 N\tau)} \\ \cdot \\ W_K(x,1)e^{i\gamma(G_y^F \tau)} \ldots W_K(x,N)e^{i\gamma(G_y^F N\tau)} \end{pmatrix} \cdot \begin{pmatrix} p(x,1) \\ p(x,2) \\ p(x,3) \\ \cdot \\ \cdot \\ \cdot \\ \cdot \\ p(x,N) \end{pmatrix}$$

[Fig 7]
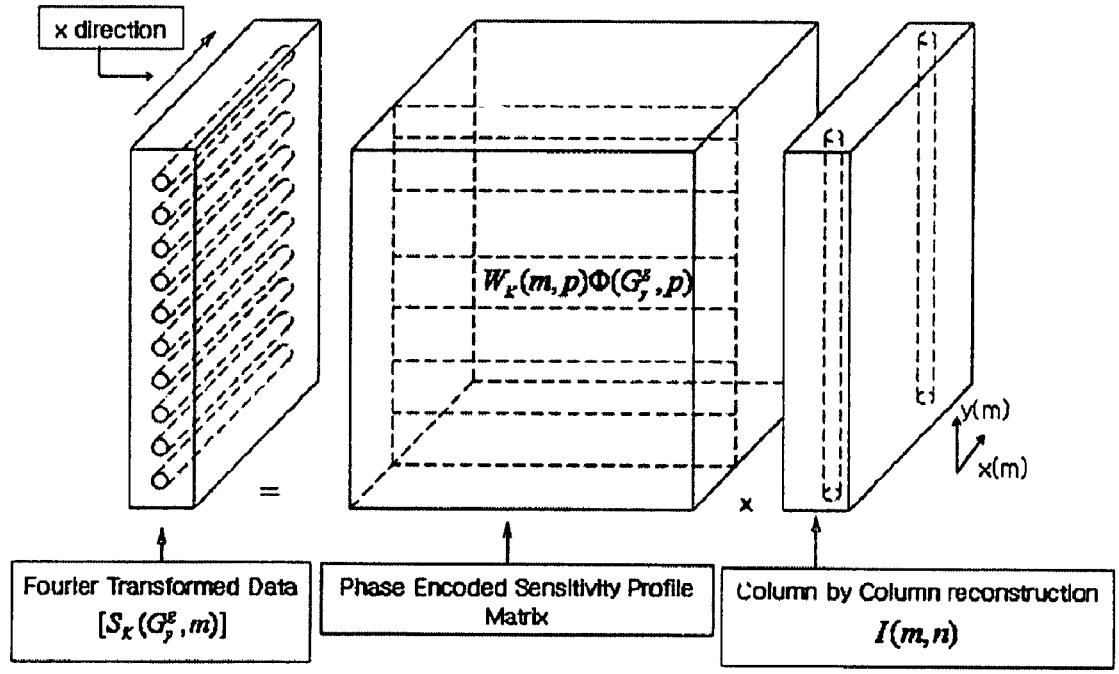
[Fig 8]
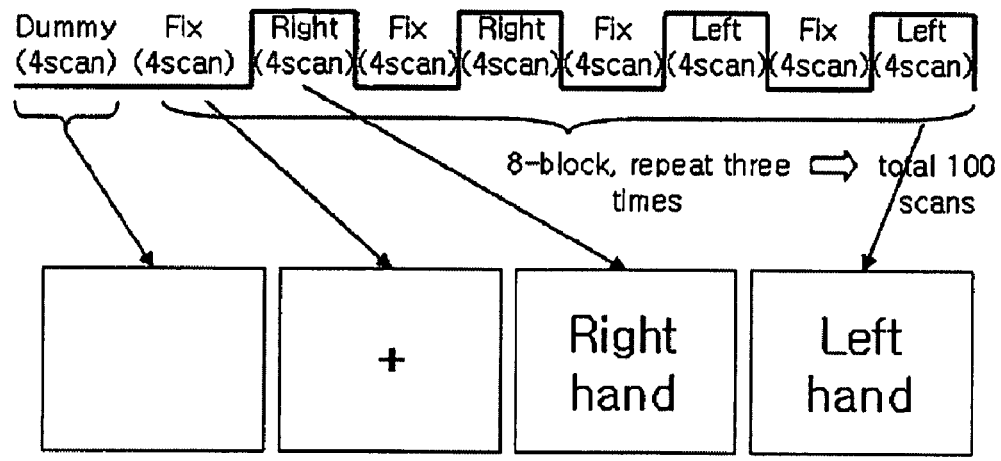

[Fig 9]
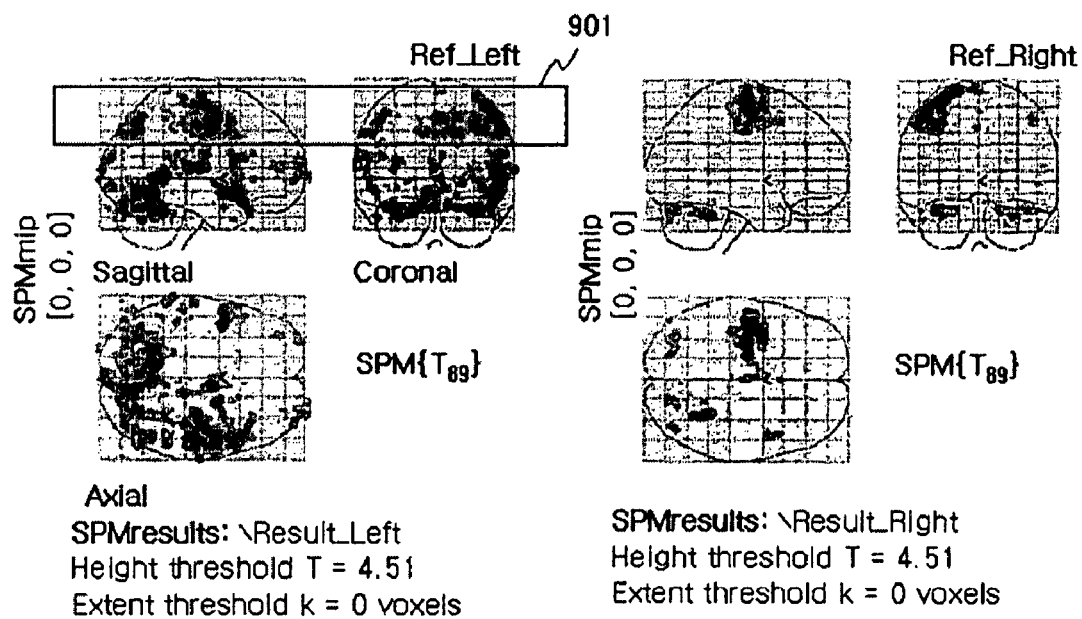
[Fig 10]
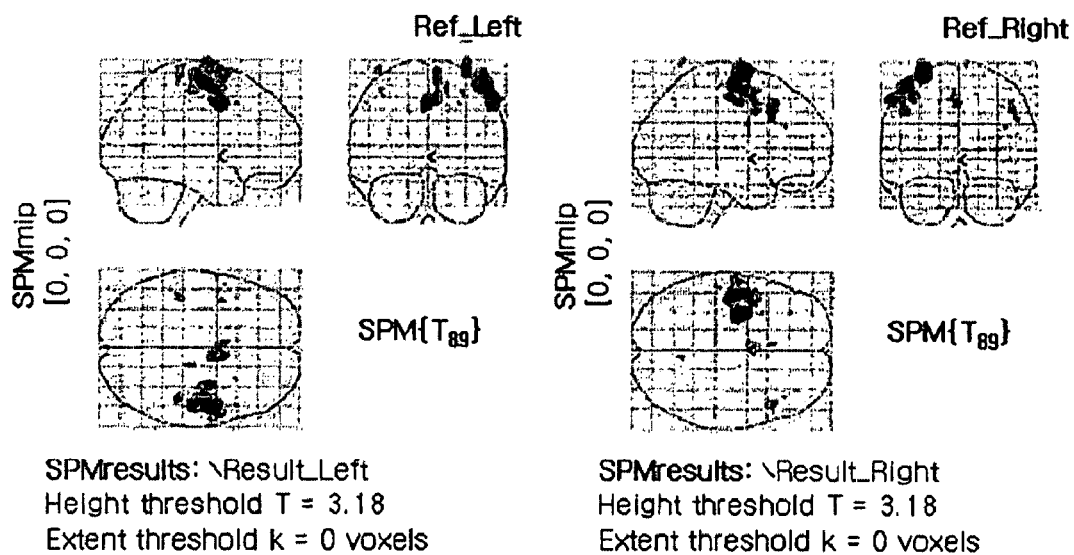

[Fig 11]
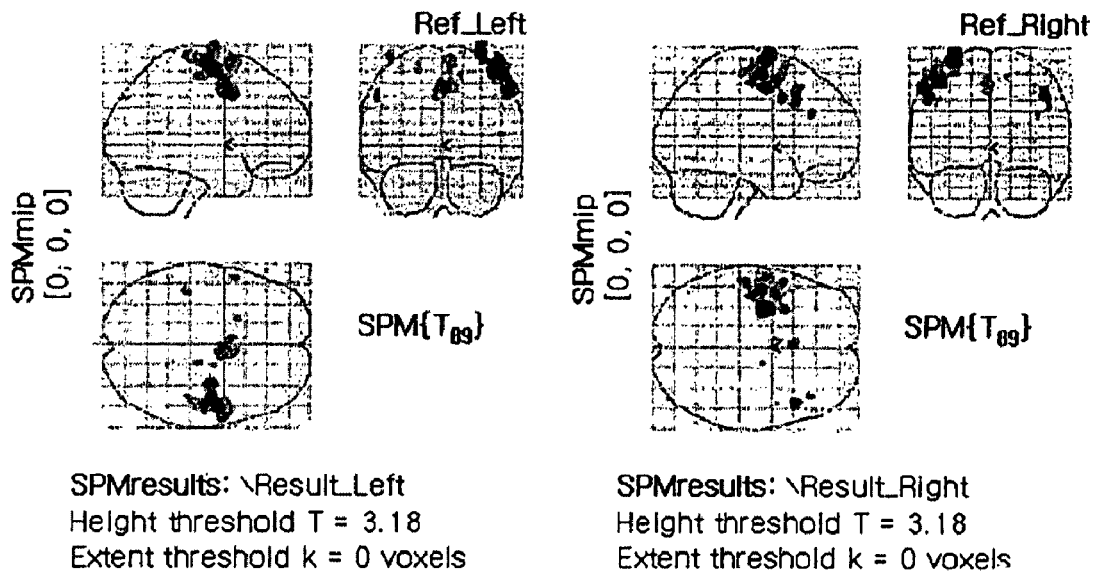
[Fig 12]
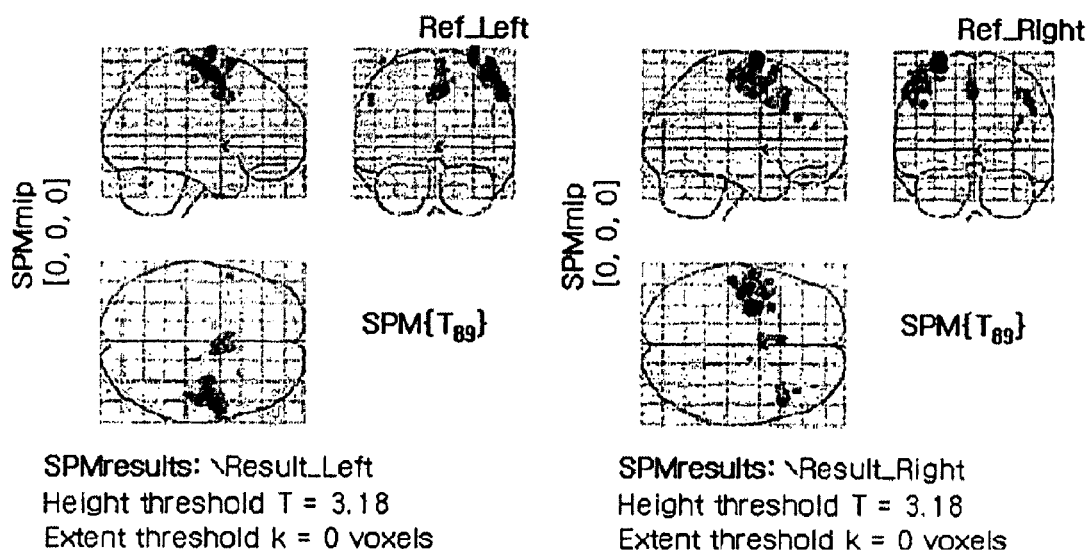

METHOD FOR GENERATING HIGH RESOLUTION MRI IMAGE AND RECORDING MEDIUM THEREOF

This Nonprovisional application claims priority under 35 U.S.C. §119(a) on Patent Application No. 10-2007-0058917 filed in Republic of Korea on Jun. 15, 2007, the entire contents of which are hereby incorporated by reference.

BACKGROUND OF THE INVENTION

1. Field of the Invention

The present invention relates to a method for generating high resolution Magnetic Resonance Imaging (hereinafter, referred to as "MRI") image.

2. Description of the Background Art

MRI is used for measuring magnetic properties of material and producing the image thereof and there have been many studies in this field. One of conventional MRI techniques can monitor physiological information of human body tissues and magnetic resonance properties of water molecules according to the types of diseases. In line with this trend, the system performance of a MRI apparatus has gradually been improved.

Functional MRI (hereinafter, referred to as "fMRI") is an imaging method for determining which part of the brain is activated according to time when the brain is under the stimulus of the sense of sight, auditory sense, movement or the like. The fMRI requires high temporal resolutions.

As a conventional method for obtaining this fMRI, an Echo Planar Imaging (hereinafter, referred to as "EPI") technique with high temporal resolution has been used a lot.

The EPI technique can be used suitably when the size of an fMRI image is 64×64, but is difficult to use when the size of an fMRI image is over 64×64 due to a low signal to noise ratio (SNR). Further, the EPI technique is advantageous in that it can obtain an image quickly unlike other conventional MRI methods, such as a gradient-echo imaging and a spin-echo imaging, but is disadvantageous in that ghost artifact or geometric distortion is generated.

Further, a MRI apparatus with an intensity of 1.5 T (Teals) or 3.0 T (Tesla) has generally been used in some hospitals or research institutes and an fMRI with this degree of a magnetic field strength is also used. However, in recent years, as an MRI apparatus with a higher magnetic field is advanced, an ultra-high field system of 7.0 T (Tesla) has begun to be used. However, it is expected that fMRI photographing using the EPI technique in this ultra-high field system is impossible because the above-described problems stands out more than the low Tesla system. Accordingly, there is a need for a method of photographing a general MRI image more quickly without EPI technique.

The Generalized Series (hereinafter, referred to as "GS") imaging technique and the parallel imaging technique, are described below with reference to the accompanying drawings.

FIG. 1 is a view illustrating a sampling method of the GS imaging technique.

The sampling method of the GS imaging technique is generally used to acquire an MRI with high temporal resolution and is a method of shortening an image acquisition time based on the fact that images in neighboring time-frames are similar to each other (refer to a reference document: Z-F. Liang and P. C. Lauterbur. An Efficient Method for Dynamic Magnetic Resonance Imaging. IEEE Transactions on Medical Imaging 1994; 13:677-686).

Referring to FIG. 1, the left-side drawing of FIG. 1 illustrates a case where magnetic resonance data is acquired by sampling it at the Nyquist rate over the whole k-space region. This method corresponds to a sampling method of a conventional imaging technique. The right-side drawing of FIG. 1 illustrates a case where magnetic resonance data is acquired by sampling it at the Nyquist rate with respect to only the low frequency region of a central portion of the whole region of the k-space. This method corresponds to a sampling method of the GS imaging technique. The term "Nyquist rate" refers to that an original signal can be recovered only when the signal is sampled at a sampling frequency twice an original signal frequency bandwidth. This minimum sampling frequency is called the Nyquist rate.

The right-side drawing of FIG. 1 shows a case where the data acquisition time is twice faster than that of the left-side drawing of FIG. 1. However, the data acquisition time can be further shortened depending on how many sampling number is set by a user.

In the sampling method of the GS imaging technique, it can be said that the high frequency component of an image is lost because only the low frequency component is sampled, but the high frequency component can be compensated for by a reference image to be obtained once for the first time by the sampling method of the conventional imaging technique. The sampling method of the GS imaging technique can shorten the image acquisition time by using the fact that images in neighboring time-frames are similar when acquiring a dynamic MRI (hereinafter, referred to as "dMRI").

In the sampling method of the GS imaging technique, an image $I_{GS}$ is represented into a linear combination, assuming that the image $I_{GS}$ is a function as in the following equation 1. An image that is finally reconstructed becomes $I_{GS}$.

$$I_{GS}(x) = \sum_n c_n \phi_n(x) \qquad \text{[Equation 1]}$$

where $\phi_n(x)$ is a basis function.

Equation 1 can be represented by a complex number sine series as in the following equation 2.

$$\phi_n(x) = I_r(x)e^{i2\pi k_n x}, \qquad \text{[Equation 2]}$$

$$I_{GS}(x) = I_r(x)\sum_n c_n e^{i2\pi k_n x}$$

where $I_r(x)$ is a reference image obtained by a general imaging method. Thus, if only $c_n$ is found, a desired image can be obtained. This can be decided by a condition that fulfills in a Fourier transform relationship such as the following equation 3.

$$\text{Constraint:} \qquad \text{[Equation 3]}$$

$$d_q(m) = \sum_x I_{GS}(x)e^{-i2\pi k_m x}$$

-continued $$d_q(m) = \sum_x I_r(x) \sum_n c_n e^{i2\pi k_n x} e^{-i2\pi k_m x}$$

$$= \sum_n \sum_x c_n I_r e^{-i2\pi(k_m - k_n)x}$$

$$= \sum_n c_n d_{c(k_m - k_n)}$$

$$\therefore d_q(m) = \sum_{n=1}^{M} c_n d_c(k_m - k_n)$$

where $d_c(m)$ are the Fourier transformation results of $I_c(x)$ and $d_q(m)$ is the Fourier transformation results of an image obtained by the sampling method of the GS imaging technique.

As described above, the sampling method of the GS imaging technique is a method of shortening an image acquisition time by sampling only M lines in a low frequency region of the whole k-space region. The sampling method of the GS imaging technique with respect to a one-dimensional signal has been described so far. It is, however, to be noted that this method can be applied to two-dimensional signals.

FIG. 2 is a view illustrating a sampling method of the parallel imaging technique.

FIG. 2(a) is a view illustrating a sensitivity encoding (SENSE) sampling method, which is one of parallel imaging techniques. For reference, SENSE is described in detail in a reference document (Pruessmann K P, Weiger M, Scheidegger M B, Boesiger P. *Sense: sensitivity encoding for fast MRI. Magn Reson Med* 1999; 42:952-962).

FIG. 2(b) shows a final MRI reconstructed by performing the Fourier transformation on magnetic resonance data obtained by the SENSE sampling method of FIG. 2(a).

In FIG. 2(a), the left-side drawing of FIG. 2(a) illustrates a case where magnetic resonance data is acquired at the Nyquist sampling distance with respect to the whole k-space region, which corresponds to the sampling method of the conventional imaging technique. The right-side drawing of FIG. 2(a) illustrates a case where magnetic resonance data is acquired at a distance twice the Nyquist sampling distance with respect to the whole k-space region, which corresponds to the sampling method of the parallel imaging technique. A data acquisition time of these methods would be twice faster than that of the conventional imaging technique. It is called reduction factor (R)=2. If the Fourier transformation is applied to the data obtained as described above, an image of a shape in which a reconstructed final MRI is folded once (2-fold) is obtained as shown in FIG. 2(b). The right-side drawing of FIG. 2(a) illustrates a case where the data acquisition time is twice fast compared with the left-side drawing of FIG. 2(a). However, the data acquisition time can be further reduced by a user depending on an image whose distance is how much greater than the Nyquist sampling distance.

In the parallel imaging technique, data is received by using a multi-channel coil such as a phased-array coil. In this case, aliasing images as many as the channel number can be obtained. Each channel has its unique property. This property decides whether the intensity of a specific portion in an image is displayed greater than the remaining portions. For example, when the number of channels is 4, top, bottom, left, and right portions of each channel have the intensity greater than that of the remaining portions. It is used as additional information for eliminating an aliasing phenomenon.

FIG. 2(b) illustrates the final MRI in which the brain of a human being is obtained as twice (R=2) the Nyquist distance by using a 4-channel coil. From FIG. 2(b), it can be seen that the images are the same, but are different in intensity distributions on a channel basis.

Images with different intensity distributions on a channel basis as described above can be modeled on the assumption that an image with uniform intensity distributions is multiplied by a component to represent the intensity. To indicate how the intensity is strong on a position basis, as described above, is called a sensitivity map. In order words, the degree of aliasing every image of each channel is dependent on the sensitivity. In this case, a case R=2 can be expressed in the following equation 4.

$$\begin{bmatrix} S_{11} & S_{12} \\ S_{21} & S_{22} \\ \vdots & \vdots \\ S_{41} & S_{42} \end{bmatrix} \begin{bmatrix} U_1 \\ U_2 \end{bmatrix} = \begin{bmatrix} v_1 \\ v_2 \\ \vdots \\ v_4 \end{bmatrix} \quad \text{[Equation 4]}$$

Where $S_{ij}$ is the sensitivity of an image that enters a $j^{th}$ aliasing term of an $i^{th}$ channel. In FIG. 2, j can comprise only 1 or 2 because of R=2. That is, a case where j is 1 corresponds to an original signal and a case where j is 2 corresponds to a signal serving as the aliasing term. In a similar way, $U_i$ is a signal value of an image that enters a $j^{th}$ aliasing term and $V_i$ is a value of an aliasing signal of an $i^{th}$ channel. This can be expressed in a simplified form as in the following equation 5.

$$SU=V \quad \text{[Equation 5]}$$

where data obtained through an experiment is V. Thus, if only S can be calculated through an algorithm, U can be known from a matrix equation such as the following equation 6.

$$SU=V,$$

$$S^T SU = S^T V,$$

$$\therefore U = (S^T S)^{-1} S^T V \quad \text{[Equation 6]}$$

where S is the above-mentioned sensitivity map. It can be found by applying an appropriate polynomial fitting process to the reference image obtained by the conventional imaging technique.

The GS imaging technique and the parallel imaging technique can be applied to an ultra-high field system without ghost artifact or geometric distortion, but is disadvantageous in that a speed in which a final MRI is obtained is slow compared with the EPI technique.

FIG. 3 is a view illustrating a previous method to improve image quality using GS and parallel imaging techniques. The technique of FIG. 3 corresponds to the method proposed by Xu (refer to a reference document: Xu D, Ying L, and Liang Z P. *Parallel Generalized Series MRI: Algorithm and Application to Cancer Imaging. In: Proceedings of the 26th Annual International Conference of the IEEE EMBS, San Francisco,* 2004).

The k-space sampling method proposed by Xu is a method of sampling M lines at the Nyquist rate in the central portion of the k-space and loosely sampling them at a rate lower than the Nyquist rate in the external portions of the k-space other than the central portion. Thus, the fact that only the central portion is to be sampled at the Nyquist rate leads to the characteristic of the GS imaging technique, and the fact that only the external portions are to be sampled loosely leads to the characteristic of the parallel imaging technique.

As shown in FIG. 3, the outermost left-side drawing of FIG. 3 is a k-space sampling diagram used to obtain a reference image and also used to acquire a conventional imaging, and the right-side drawing of FIG. 3 corresponds to the sampling method proposed by Xu.

The method proposed by Xu is focused on improving the quality of an image that is further reconstructed by combining the GS imaging technique and the parallel imaging technique. This method is basically not a method of further increasing temporal resolutions. Accordingly, in this method, the quality of a reconstructed image is better compared with when using each imaging technique (the GS imaging technique or the parallel imaging technique), but is problematic in that temporal resolutions are lowered.

SUMMARY OF THE INVENTION

Accordingly, an embodiment of the present invention is directed to provide a high-resolution MRI image generating method using a generalized series parallel imaging technique, which can obtain an fMRI and a dMRI wish higher resolutions and an improved quality and can be applied to an ultra-high field MRI system, and a recording medium thereof.

Accordingly, an embodiment of the present invention is directed to provide a high-resolution MRI image generating method using a generalized series parallel imaging technique, and a recording medium thereof.

According to an embodiment of the present invention, there is provided a high-resolution MRI image generating method using a generalized series parallel imaging technique, comprising the steps of selecting only a predetermined low frequency band of all frequency bands, and sampling the predetermined low frequency band of all frequency bands at a lower rate than a Nyquist rate to acquire magnetic resonance data.

The method of sampling is a SPACE RIP (sensitivity profiles from an array of coils for encoding and reconstruction in parallel) sampling method.

The high-resolution MRI image generating method can further comprise the steps of generating an intermediate MRI image by reconstructing the magnetic resonance data with a reconstruction method of a generalized series imaging technique, and generating a final MRI image, in which the magnetic resonance data has been reconstructed, by reconstructing the intermediate MRI image with a reconstruction method of a parallel imaging technique.

The step of generating the intermediate MRI image can comprise a regularization method.

The step of generating the final MRI image can comprise a regularization method.

The reconstruction method of the parallel, imaging technique is a SPACE RIP reconstruction method.

According to another embodiment of the present invention, there is provided a computer readable recording medium implemented with a program for executing a high-resolution MRI generating method using a generalized series parallel imaging technique, the high resolution MRI image generating method comprising the steps of selecting only a predetermined low frequency band of all frequency bands, and sampling the predetermined low frequency band of all frequency bands at a lower rate than a Nyquist rate to acquire magnetic resonance data.

The method of sampling is a SPACE RIP (sensitivity profiles from an array of coils for encoding and reconstruction in parallel) sampling method.

The high-resolution MRI image generating method can further comprise the steps of generating an intermediate MRI image by reconstructing the magnetic resonance data with a reconstruction method of a generalized series imaging technique and generating a final MRI image, in which the magnetic resonance data has been reconstructed, by reconstructing the intermediate MRI image with a reconstruction method of a parallel imaging technique.

The step of generating the intermediate MRI image can comprise a regularization method.

The step of generating the final MRI image can comprise a regularization method.

The reconstruction method of the parallel imaging technique is a SPACE RIP reconstruction method.

BRIEF DESCRIPTION OF THE DRAWINGS

FIG. 1 is a view illustrating a sampling method of the GS imaging technique;

FIG. 2 is a view illustrating a sampling method of the parallel imaging technique;

FIG. 3 is a view illustrating a previous method to improve image quality using GS and parallel imaging techniques;

FIG. 4 is a view illustrating a detailed sampling method of a high-resolution MRI image generating method using a generalized series parallel imaging technique in accordance with an embodiment or the present invention;

FIG. 5 is a view illustrating a reconstruction method of the high-resolution MRI image generating method using the generalized series parallel imaging technique in accordance with an embodiment of the present invention;

FIG. 6 is a view illustrating a matrix equation for reconstructing one column in a SPACE RIP sampling method;

FIG. 7 is a diagram illustrating column-by-column reconstruction;

FIG. 8 is a view illustrating an fMRI paradigm in an experiment;

FIG. 9 is a view illustrating the analysis results of an fMRI data reconstructed by using only the EPI technique;

FIG. 10 is a view illustrating the analysis results of an fMRI data reconstructed by using only a parallel imaging technique;

FIG. 11 is a view illustrating the analysis results of an fMRI reconstructed by using only a GS imaging technique; and FIG. 12 is a view illustrating the analysis results of an fMRI data reconstructed by the high-resolution MRI image generating method using the generalized series parallel imaging technique in accordance with an embodiment of the present invention.

DETAILED DESCRIPTION OF PREFERRED EMBODIMENTS

The present invention will now be described in detail in connection with specific embodiments with reference to the accompanying drawings.

FIG. 4 is a view shown to compare and describe, in detail, a sampling method when acquiring magnetic resonance data (or GS-parallel data) of a high-resolution MRI image generating method using a generalized series parallel imaging technique (hereinafter, referred to as "GS-parallel imaging technique") in accordance with an embodiment of the present invention. FIG. 4(a) illustrates a sampling method of a conventional imaging technique, FIG. 4(b) illustrates a sampling method of a parallel imaging technique, FIG. 4(c) illustrates a sampling method of a GS imaging technique, and FIG. 4(d) illustrates a sampling method of an imaging method in accordance with the present invention, in which the characteristics of FIGS. 4(b) and 4(c) are included.

Referring to FIG. 4, in the high-resolution MRI image generating method using the GS-parallel imaging technique according to an embodiment of the present invention, magnetic resonance data (or GS-parallel data) is acquired by selecting only a predetermined low frequency band of all frequency bands, and sampling the predetermined low frequency band of all frequency bands at a lower rate than a Nyquist rate to acquire magnetic resonance data. Here, if user is a person having ordinary skill in the art, the person having ordinary skill in the art can select the predetermined low frequency band at random.

In an embodiment of the present invention, the method of sampling the frequency band at a lower rate than that of the Nyquist rate can use not only SPACE RIP (refer to a reference document: Kyriakos W E, Panych L P, Kacher D F, Westin C F, Bao S M, Mulkern R V and Jolesz F A. Sensitivity Profiles From an Array of Coils for Encoding and Reconstruction in Parallel (SPACE RIP). Magn Reson Med 2000; 44:301-308), but also SMASH (refer to a reference document: Sodickson D K, Manning W J. Simultaneous acquisition of spatial harmonics (SMASH): fast imaging with radiofrequency coil arrays. Magn Reson Med 1997; 38:591-603.), SENSE (Pruessmann K P, Weiger M, Scheidegger M B, Boesiger P. SENSE:sensitivity encoding for fast MRI. Magn Reson Med 1999; 42:952-962), PILS (refer to a reference document: Griswold M A, Jakob P M, Nittka M, Goldfarb J W and Haase A. Partially Parallel Imaging With Localised Sensitivities (PILS). Magn Reson Med 2000; 44:602-609.), GRAPPA (refer to a reference document: Griswold M A, Jakob P M, Heidemann R M, Nittka M, Jellus V, Wang J, Kiefer B and Haase A. Generalized Autocalibrating Partially Parallel Acquisitions (GRAPPA). Magn Reson Med 2002; 47:1202-1210.) or the like.

In particular, the SPACE RIP sampling method has the following advantages. The SPACE RIP sampling method can use a sampling method of a specific distance in which a low frequency region is sampled closely and a high frequency region is sampled loosely because important information of an MRI image generally exists in the low frequency region. In this case, high-quality images can be obtained within the same time.

In this case, the high-resolution MRI image generating method using the GS-parallel imaging technique in accordance with an embodiment of the present invention can be implemented by using not only SPACE RIP, but also SMASH (refer to a reference document: Sodickson D K, Manning W J. Simultaneous acquisition of spatial harmonics (SMASH): fast imaging with radiofrequency coil arrays. Magn Reson Med 1997; 38:591-603.), SENSE (Pruessmann K P, Weiger M, Scheidegger M B, Boesiger P. SENSE:sensitivity encoding for fast MRI. Magn Reson Med 1999; 42:952-962), PILS (refer to a reference document: Griswold M A, Jakob P M, Nittka M, Goldfarb J W and Haase A. Partially Parallel Imaging with Localised Sensitivities (PILS). Magn Reson Med 2000; 44:602-609.), GRAPPA (refer to a reference document: Griswold M A, Jakob P M, Heidemann R M, Nittka M, Jellus V, Wang J, Kiefer B and Haase A. Generalized Autocalibrating Partially Parallel Acquisitions (GRAPPA). Magn Reson Med 2002; 47:1202-1210.) or the like.

FIG. 5 is a view illustrating a reconstruction method of the high-resolution MRI image generating method using the GS-parallel imaging technique in accordance with an embodiment of the present invention. FIG. 5(a) illustrates GS-parallel data (or magnetic resonance data) generated by the sampling method of FIG. 4(d), FIG. 5(b) illustrates an intermediate MRI image by reconstructing the magnetic resonance data with a reconstruction method of the GS imaging technique, and FIG. 5(c) illustrates a final MRI image, in which the magnetic resonance data has been reconstructed, by reconstructing the intermediate MRI image with a reconstruction method of the parallel imaging technique.

Referring to FIG. 5, the high-resolution fMRI image generating method using the GS-parallel imaging technique in accordance with an embodiment of the present invention can comprise the steps of generating an intermediate MRI image by reconstructing the magnetic resonance data with a reconstruction method of a generalized series imaging technique, and generating a final MRI image, in which the magnetic resonance data has been reconstructed, by reconstructing the intermediate MRI with a reconstruction method of a parallel imaging technique.

In this case, SPACE RIP can be used as the reconstruction method of the parallel imaging technique. It is also to be noted that the reconstruction method of the parallel imaging technique is not limited to the SPACE RIP sampling method, but a final MRI image reconstructed by SMASH, SENSE, PILS, GRAPPA or the like can be generated.

The reconstruction method of the parallel imaging technique using SPACE RIP is as follows.

Magnetic resonance data received from a coil having a sensitivity profile $w_k(x,y)$ can be expressed in the following equation 7.

$$S_k(G_y^g, t) = \int\int r(x, y) W_k(x, y) \exp\{i\gamma(G_x xt + G_y^g y\tau)\} dx dy \quad \text{[Equation 7]}$$

where if the Fourier transformation is performed only in the x direction, it results in, $$S_k(G_y^g, x) = \int r(x, y) W_k(x, y) e^{i\gamma(G_y^g y\tau)} dy$$

This can be expressed in the following equation 8 by using a spanning equation in a discrete domain.

$$S_k(G_y^g, x) = \sum_{n=1}^{N} \rho(x, n) W_k(x, n) e^{i\gamma(G_y^g n\tau)} \quad \text{[Equation 8]}$$

$$S_k(G_y^g, x) =$$

$$\sum_{n=1}^{N} \rho(x, n) W_k(x, n') e^{i\gamma(G_y^g n'_\tau)} \int \Omega_n(y) \Omega_{n'}(y) dy$$

Lastly, if the orthonormal property is used, the following equation 9 can be obtained.

$$\int \Omega_n(y) \Omega_{n'}(y) dy = \delta(n, n') \quad \text{[Equation 9]}$$

$$S_k(G_y^g, x) = \sum_{n=1}^{N} \rho(x, n) W_k(x, n) e^{i\gamma(G_y^g \tau)}$$

The above equations 7 to 9 can be expressed in a matrix equation as shown in FIG. 6. In other words, $\rho_{vector}$ can be found by solving the matrix equation.

Thus, if the SPACE RIP sampling method is used as the reconstruction method of the parallel imaging technique, an MRI image can foe reconstructed on a column basis as shown in FIG. 7. The SPACE RIP sampling method can improve a regularization effect compared with SENSE sampling method.

At this time, when reconstructing the final MRI image in accordance with an embodiment of the present invention, the regularization method can also be used.

In the event that a matrix having a large size is used in order to model the phenomenon of the natural world, an ill-posed problem is frequently encountered. The ill-posed problem refers to one where the condition number of a w matrix of FIG. 6 is very great.

The condition number r is defined as the ratio of the greatest value to the smallest value, of a singular value of the matrix. If the value is very great, it leads to the ill-posed problem. In order to overcome this problem, the regularization method is used. The term "regularization method" refers to solving a matrix equation (S=Wρ) by adding a condition term, such as the following equation 10, without solving a solution using $\rho = W^{-1}s$.

$$\min_\rho \{\|W\rho - s\|^2 + \lambda^2 \|I\rho\|^2\}$$ [Equation 10]

where an explicit solution of the equation 10 is identical to the following equation 11, λ is a regularization parameter and is a value that varies according to a matrix system, and I is an identity matrix.

$$\therefore \rho = \{W^T W + \lambda^2 I\}^{-1} A^T S$$ [Equation 11]

By adding the condition term of the equation 10 as described above, the stability of the matrix system can be improved and a more robust final MRI image can be reconstructed.

FIG. 8 is a view illustrating an fMRI paradigm in an experiment. Referring to FIG. 8, a subject that performs an experiment enters an MRI apparatus and then waits for until a drawing in which "+" is indicated appears. The subject slightly moves his left hand when a drawing in which a letter "Left Hand" is written appears, and slightly moves his right hand when a drawing in which a letter "Right Hand" is written appears.

In FIG. 8, the term "scan" refers to a frame of an image. A stimulus of the right hand or the left hand has to be maintained while four frames are photographed by the MRI apparatus. The reason why the drawing has "+" indicated therein is to obtain a reference image, that is, for the purpose or statistically analyzing which difference is there between an image, which is obtained in a time zone that proposes the stimulus (the left hand or the right hand), and an image, which is obtained in a time tone that proposes "+". This statistical analysis says that which part of the brain is responsible for the movement of the right hand or the left hand.

For comparison of the experiment as shown in FIG. 8, a case where an fMRI image reconstructed by the EPI technique, the parallel imaging technique or the GS imaging technique, which could be used when acquiring an fMRI image in the prior art, and the high resolution fMRI image generating method using the GS-parallel imaging technique in accordance with an embodiment of the present invention will be compared with reference to FIGS. 9 to 12.

fMRI parameters when performing an experiment by using the EPI technique are as follows.
TR=3000 ms,
TE=35 ms,
Slice Thickness=5 mm,
Number of slice=28,
Matrix size=64×64,
Time/Scan=3 sec,
Sequence=EPI fMRI parameters when performing an experiment by the high resolution fMRI image generating method using the GS-parallel imaging technique in accordance with an embodiment of the present invention are as follows.
TR=125 ms,
TE=34 ms,
Slice Thickness=5 mm,
Number of slice=3,
Matrix size=24×64,
Time/Scan=3 sec,
Sequence=Gradient Echo At this time, in order to support both the EPI technique, the parallel imaging technique, the GS imaging technique and the high-resolution MRI image generating method using the GS-parallel imaging technique according to an embodiment of the present invention, data where the reduction factor R=2.67 in the single parallel imaging technique was obtained. R=2.67 means that 24 of 64 phase encoding can be performed in the event that 64 phase encoding must be carried out. Meanwhile, the reason why the number of slices in this experiment is smaller than that of the EPI technique is that time is limited. This is not a significant problem if a portion where a stimulus is expected to appear well in the brain at an early stage is selected properly.

As described above, data has been obtained as R=2.67 of the parallel imaging technique. However, if the data is reconstructed by the parallel imaging technique to obtain a fail k-space and the GS imaging technique is applied to only 32 lines at a central portion of the full k-space, the experimental results using the single GS imaging technique can be obtained. Further, if only 16 lines at the central portion are selected from the data obtained as R=2.67 at the early stage and the proposed method is applied to the 16 lines, the experimental results of the high-resolution MRI image generating method using the GS-parallel imaging technique in accordance with an embodiment of the present invention can be obtained.

FIG. 9 is a view illustrating the analysis results of an fMRI image reconstructed by using only the EPI technique. The left-side drawing of FIG. 9 is a map showing the activity region of the brain when the left hand is stimulated. The right-side drawing of FIG. 9 is a map showing the activity region of the brain when the right hand is stimulated. The greater the activity, the deeper the color. The map is divided into three sections depending on from which direction the three-dimensional brain is seen. The three sections comprise sagittal, coronal, and axial sections.

The right hemisphere is responsible for left hand movement. From the axial section of FIG. 9, it can be seen that the activity of the right hemisphere is greater than that of the left hemisphere. On the other hand, in the case of right hand movement, the activity of the left hemisphere is greater than that of the right hemisphere. Further, the brain, which is responsible for exercise stress, is located at an upper part of the brain as can be seen from a box (901) of the left-side drawing. It can be seen that this part has a darker color compared with other parts.

FIG. 19 is a view illustrating the analysis results of an fMRI image reconstructed by using only the parallel imaging technique. As shown in FIG. 10, it was measured that in the case of left hand exercise, the activity was high in the right hemisphere of the brain and in the case of right hand exercise, the activity was high in the left hemisphere of the brain.

However, the reason why the location where the brain was activated was small unlike the case shown in FIG. 9 is that the number of slices was small compared with EPI technique as described above. In this case, the location of the slice was limited to the box (901) portion of FIG. 9 and becomes Region Of Interest (ROI). That is why the activity is not seen in the remaining parts.

It can be seen that the activity is similar in desired ROI when compared with the experimental results using the EPI technique.

FIG. 11 is a view illustrating the analysis results of an fMRI image reconstructed by using only the GS imaging technique. As shown in FIG. 11, it can be seen that the activity pattern of the brain is almost similar to that of only the parallel imaging technique of FIG. 10. Through this, it can be seen that the image reconstructed by only the GS imaging technique has no difference from the image reconstructed by only the parallel imaging technique.

FIG. 12 is a view illustrating the analysis results of an fMRI reconstructed by the high-resolution MRI image generating method using the GS-parallel imaging technique in accordance with an embodiment of the present invention. As shown in FIG. 12, it can be seen that the activity pattern of the brain is almost similar to those of FIGS. 10 and 11. Through this, it can be seen that the image reconstructed by the GS-parallel imaging technique has almost no difference from the images reconstructed by the GS imaging technique or the parallel imaging technique.

Accordingly, the high-resolution MRI image generating method using the GS-parallel imaging technique in accordance with an embodiment of the present invention can be widely used to acquire an MRI image requiring high temporal resolutions and can also be generally used to image a subject that moves as time goes by in the medical field.

Further, the high-resolution MRI image generating method of the present invention can be used for an ultra-high field system of 7.0 T (Tesla) and an ultra-high field brain fMRI apparatus.

Further, in the high-resolution MRI image generating method of the present invention, ghost artifact and/or geometric distortion are rarely generated in reconstructed images unlike the EPI technique.

As described above in detail, in accordance with the present invention, the high-resolution MRI image generating method using the GS-parallel imaging technique, which can be applied to an ultra-high field system and has high temporal resolutions, and a recording medium thereof are provided.

While the invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method for generating a high-resolution magnetic resonance imaging (MRI) image on a display device by using a generalized series parallel imaging method, the method comprising the steps of:
   selecting only a predetermine low frequency band of all frequency bands;
   sampling the predetermine low frequency band of all frequency bands at a lower rate than a Nyquist rate to acquire magnetic resonance data; and
   producing on the display device a final MRI image that is generated using the magnetic resonance data.

2. The method of claim 1, wherein the method of sampling is a SPACE RIP (sensitivity profiles from an array of coils for encoding and reconstruction in parallel) sampling method.

3. The method of claim 1, wherein the step of producing the final MRI image comprises:
   generating an intermediate MRI image by reconstructing the magnetic resonance data with a reconstruction method of a generalized series imaging technique; and
   generating the final MRI image, in which the magnetic resonance data has been reconstructed, by reconstructing the intermediate MRI image with a reconstruction method of a parallel imaging technique.

4. The method of claim 3, wherein the step of generating the intermediate MRI image comprises a regularization method.

5. The method of claim 3, wherein the step of generating the final MRI image comprises a regularization method.

6. The method of claim 3, wherein the reconstruction method of the parallel imaging technique is a SPACE RIP reconstruction method.

7. A computer readable recording medium implemented with a program for executing a high-resolution MRI generating method that produces a high-resolution MRI image on a display device by using a generalized series parallel imaging method, the high-resolution MRI image generating method comprising the steps of:
   selecting only a predetermined low frequency band of all frequency bands; and
   sampling the predetermined low frequency band of all frequency bands at a lower rate than a Nyquist rate to acquire magnetic resonance data.

8. The compute readable recording medium of claim 7, wherein the method of sampling is a SPACE RIP (sensitivity profiles from an array of coils for encoding and reconstruction in parallel) sampling method.

9. The computer readable recording medium of claim 7, further comprising the steps of:
   generating an intermediate MRI image by reconstructing the magnetic resonance data with a reconstruction method of a generalized series imaging technique; and
   generating a final MRI image, in which the magnetic resonance data has been reconstructed, by reconstructing the intermediate MRI image with a reconstruction method of a parallel imaging technique.

10. The computer readable recording medium of claim 9, wherein the step of generating the intermediate MRI image comprises a regularization method.

11. The computer readable recording medium of claim 9, wherein the step of generating the final MRI image comprises a regularization method.

12. The computer readable recording medium of claim 9, wherein the reconstruction method of the parallel imaging technique is a SPACE RIP reconstruction method.

* * * * *